(12) United States Patent
Abdelgadir et al.

(10) Patent No.: US 6,624,039 B1
(45) Date of Patent: Sep. 23, 2003

(54) ALIGNMENT MARK HAVING A PROTECTIVE OXIDE LAYER FOR USE WITH SHALLOW TRENCH ISOLATION

(75) Inventors: Mahjoub A. Abdelgadir, Orlando, FL (US); Stephen C. Kuehne, Orlando, FL (US); Alvaro Maury, Singapore (SG); Scott F. Shive, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 52 days.

(21) Appl. No.: 09/615,122

(22) Filed: Jul. 13, 2000

(51) Int. Cl.[7] .............................................. H01L 21/76
(52) U.S. Cl. ...................................................... 438/401
(58) Field of Search ............................................ 438/401

(56) References Cited

U.S. PATENT DOCUMENTS

| 5,578,519 A | * | 11/1996 | Cho | |
|---|---|---|---|---|
| 5,786,260 A | | 7/1998 | Jang et al. | |
| 5,893,744 A | | 4/1999 | Wang | |
| 5,963,816 A | * | 10/1999 | Wang et al. | 438/401 |
| 5,998,279 A | | 12/1999 | Liaw | |
| 6,181,018 B1 | * | 1/2001 | Saino | 257/797 |
| 6,232,200 B1 | * | 5/2001 | Chu | 438/401 |
| 6,239,031 B1 | * | 5/2001 | Kepler et al. | 438/692 |
| 6,326,309 B2 | * | 12/2001 | Hatanaka et al. | 438/693 |

* cited by examiner

Primary Examiner—Jey Tsai (57) ABSTRACT

The present invention provides a semiconductor device including large topography alignment marks, and a method of manufacture therefor. The method of manufacturing the semiconductor device includes forming an isolation trench and an alignment mark in a substrate to a substantially common depth, and forming an etch stop layer in the alignment mark.

17 Claims, 12 Drawing Sheets

ALIGNMENT MARK HAVING A PROTECTIVE OXIDE LAYER FOR USE WITH SHALLOW TRENCH ISOLATION

TECHNICAL FIELD OF THE INVENTION

The present invention is directed, in general, to a semiconductor device and a method of manufacturing the device. More specifically, the semiconductor device includes an alignment mark with a depth that is substantially equal to a depth of an isolation trench. Further, the alignment mark includes a protective etch stop that is deposited within the alignment mark.

BACKGROUND OF THE INVENTION

During semiconductor manufacturing processes, layers of various materials are deposited or grown on a wafer. Chemical mechanical polishing (CMP) is the standard technique to planarize oxide in shallow trench isolation (STI) structures. As a result of the CMP step, the wafer surface is very planar, and the only topography remaining is the height of the step created between active areas and the oxide trench. After CMP, the trench oxide can be about 80 nm above the silicon level. However, due to a hydrogen fluoride de-glaze for nitride strip and other oxide removal operations, the step can be reduced to about 10 nm to 30 nm, which creates a topography that can be difficult for a photolithographic tool to detect.

Following STI, gate oxide is grown and the transistor gate stack is deposited. Usually, this stack has an upper metallic layer, such as tungsten silicide (WSi), to reduce total resistivity. The pattern of each layer must be precisely aligned to the patterns of the previous layer to ensure that the device operates properly.

To achieve proper alignment, alignment marks are formed on the wafer and are used by the steppers, so that in each photolithographic step, the mask will be properly aligned according to the marks in the previous layers. Typically the stepper detects the alignment marks through various transparent layers. However, the use of the reflective WSi interferes with the photolithographic process by reflecting interfering light patterns such that the photoresist is not properly exposed.

In such instances, it is difficult to detect the alignment marks through the optically reflective material. In situations where a reflective material overlays the alignment marks, the semiconductor manufacturing industry relies on relief topography at the edge of the alignment feature for accurate alignment. In many situations, however, this relief is too small because of previous processing steps, and alignment not only becomes very difficult, but impossible in extreme cases. Thus, several approaches have been developed to address this problem.

One approach is to use a thicker nitride layer to enhance the height of the step between the trench oxide and the active area. This consists of increasing the nitride layer from the traditional thickness of about 160 nm to a thickness of about 180 nm. However, a problem with the 20 nm increase in thickness is that it is unpredictable whether it will or will not alleviate the problem in a particular instance. Moreover, increasing the nitride thickness typically adds unwanted stresses and deposition complications.

Another approach is to use an extra photo step to etch holes in the trench oxide that form large topography alignment features. The large topography alignment features provide the step height needed, but the large topography alignment features also add an extra photolithographic level, which increases cost and cycle times.

Accordingly, what is needed in the art is an alignment feature for use in semiconductor devices having optically reflective materials located therein, and that does not experience the problems associated with the prior art alignment features.

SUMMARY OF THE INVENTION

To address the above-discussed deficiencies of the prior art, the present invention provides a semiconductor device and a method of its manufacture. The method of manufacturing the semiconductor device includes forming an isolation trench in a substrate, forming an alignment mark in the substrate and forming an etch stop layer in the alignment mark. As discussed below, the alignment mark provided by the present invention can easily be incorporated into a conventional operative integrated circuit.

In another aspect, the present invention provides a semiconductor device. In one advantageous embodiment, the semiconductor device includes a transistor isolation structure formed in a semiconductor substrate and an alignment mark formed in the semiconductor substrate wherein the alignment mark is substantially free of a nitride layer and has a gate material deposited therein. The transistor isolation structure has a depth and the alignment mark preferably has a depth substantially equal to the depth of the transistor isolation structure, which are set forth in the above-discussed method embodiments. In another aspect, the gate material comprises polysilicon and further includes an oxide layer located under the gate material and a reflective coating located over the gate material. Other embodiments of the semiconductor device include embodiments provided by the above-discussed method embodiments.

Thus, in one aspect, the present invention provides robust alignment features for non-transparent gate layers that can be easily detected by a photolithographic tool. These unique alignment marks not only eliminate the need for a dedicated alignment mark mask, but they also substantially reduce the small step problems currently caused by chemical mechanical polishing processes commonly used during the manufacturing process.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying. FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
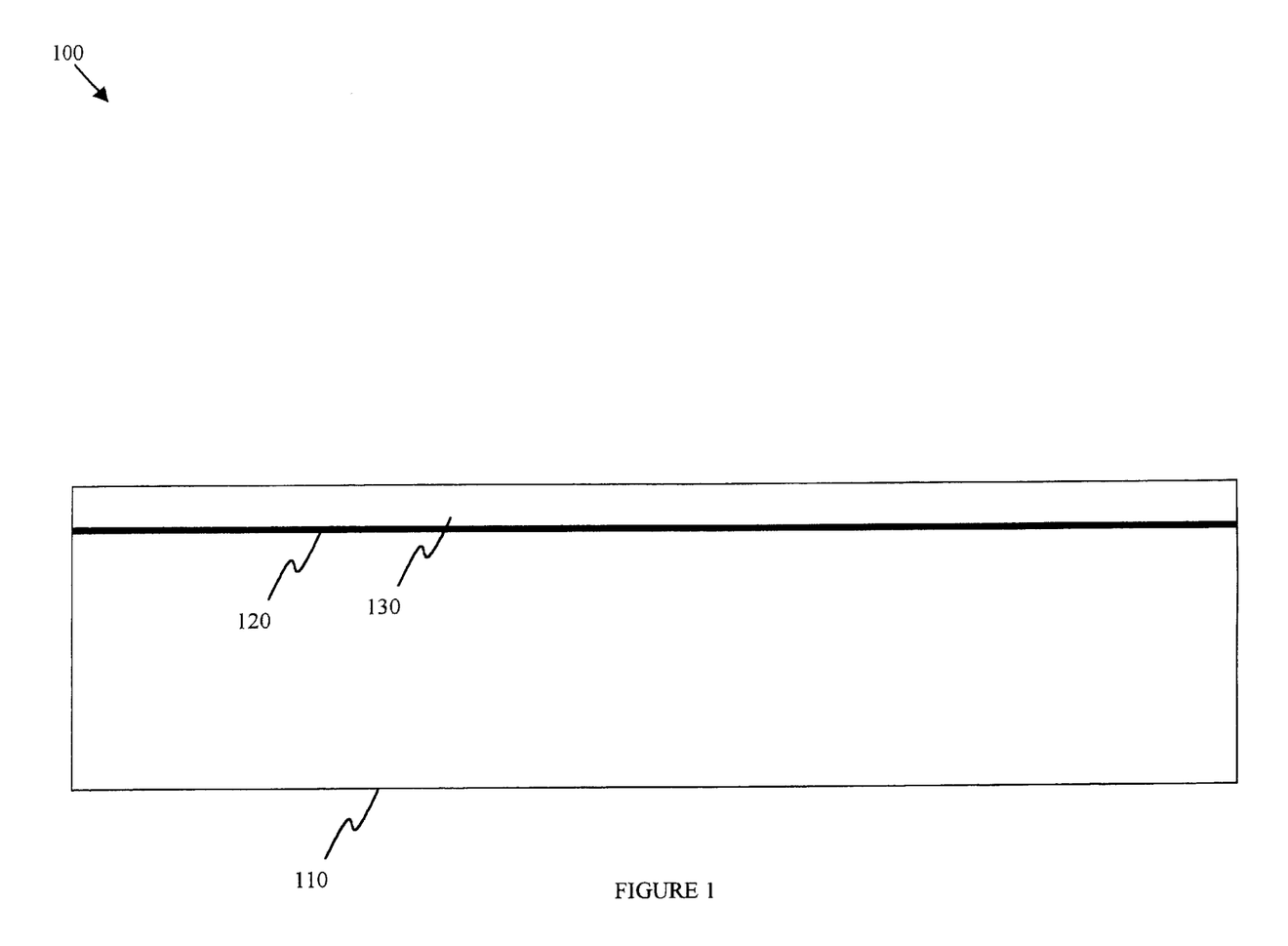
FIG. 1 illustrates a cross-sectional view of a partially completed semiconductor device at an initial stage of manufacture, and as disclosed by the present invention.

Referring initially to FIG. 1, illustrated is a cross-sectional view of a partially completed semiconductor device 100 at an initial stage of manufacture, and as disclosed by the present invention. The partially completed semiconductor device 100, in the illustrative embodiment, includes a conventionally formed semiconductor substrate 110, with a conventionally formed pad oxide 120 located thereon. It should be noted that the semiconductor wafer substrate 110 may be any substrate located in the semiconductor device 100, including the wafer itself or a substrate located above the wafer. Typically the pad oxide 120 may be grown to any desired thickness. Also included in the partially completed semiconductor device 100 is a conventionally formed isolation layer 130, for example a nitride layer, which may be formed to a thickness ranging from about 120 nm to about 160 nm.

Figure 2:
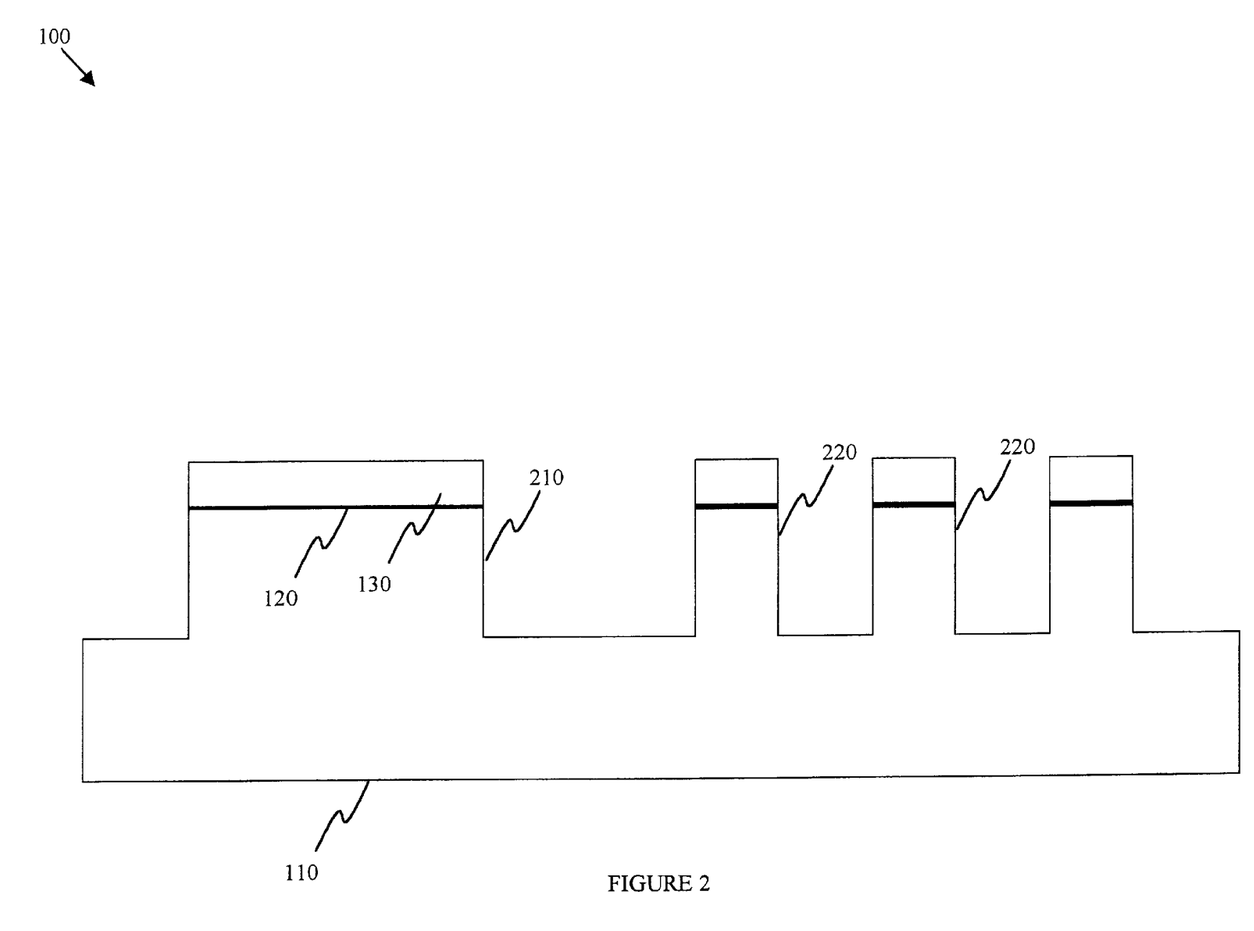
FIG. 2 illustrates the partially completed semiconductor device illustrated in FIG. 1, after formation of an isolation trench and alignment marks.

Turning to FIG. 2, illustrated is the partially completed semiconductor device 100 of FIG. 1, after formation of an isolation trench 210 and alignment marks 220, which are preferably defined and formed simultaneously. Generally this is followed by a trench etch through the pad oxide 120 and isolation layer 120, as shown. It should be understood that the isolation trench 210 and the alignment marks 220 can each be patterned and defined in separate steps if so desired. The method of forming the isolation trench 210 and alignment marks 220 has only briefly been described; however, one having skill in the art generally knows the conventional methods used to form openings in a semiconductor substrate.

In contrast to traditional isolation trench and alignment mark technology, the isolation trench 210 and alignment marks 220 may be formed to a substantially common depth, for example to a depth ranging from about 200 nm to about 1000 nm. In an exemplary embodiment, the isolation trench 210 and the alignment marks 220 may be formed to a substantially common depth of about 300 nm. Likewise, the alignment mark 220 may have a width ranging from about 200 nm to about 1000 nm. More generally, the alignment mark 220 should have a depth to width ratio that allows for easy detection of the alignment mark 220 even after subsequent fabrication processes that typically make conventional alignment marks difficult to detect with a photolithographic tool.

Figure 3:
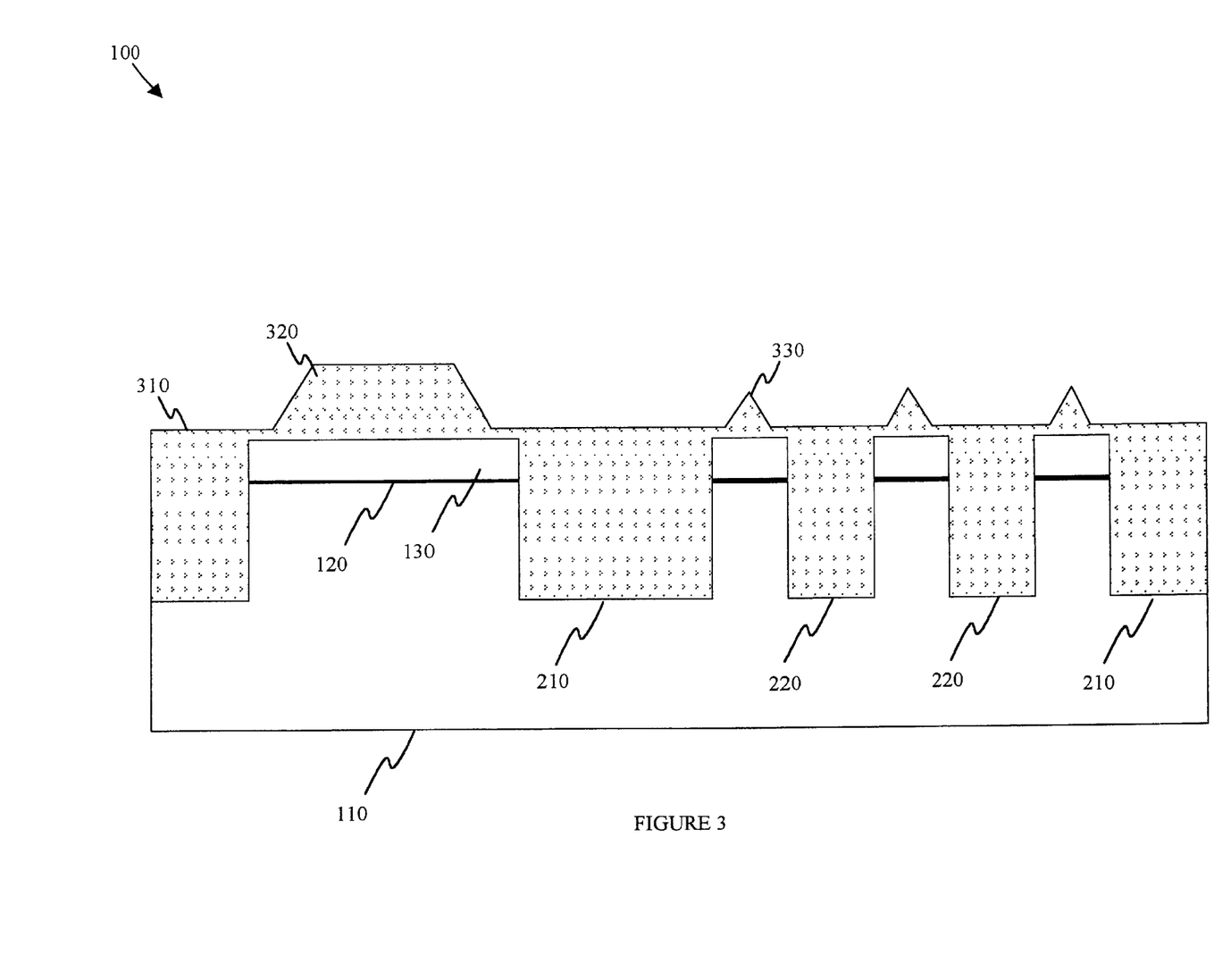
FIG. 3 illustrates the isolation trench and alignment marks after formation of an oxide liner and a gap oxide.

Turning to FIG. 3, illustrated are the isolation trench 210 and alignment marks 220 after deposition of an oxide 310. The oxide 310 may be deposited using an oxide deposition process, for example a high density plasma (HDP) oxide deposition process. Typically, the oxide 310 may be deposited to a thickness of about 500 nm. However, in other embodiments the oxide 310 may be deposited to a thickness of about 700 nm, followed by a hydrofluoric (HF) etch of the oxide 310. The hydrofluoric etch smooths the topography created during deposition of the oxide 310 and leaves the oxide 310 having a thickness of about 500 nm. As illustrated, the deposition of the oxide 310 may form oxide mesas 320 over larger features and oxide horns 340 over smaller features.

Figure 4:
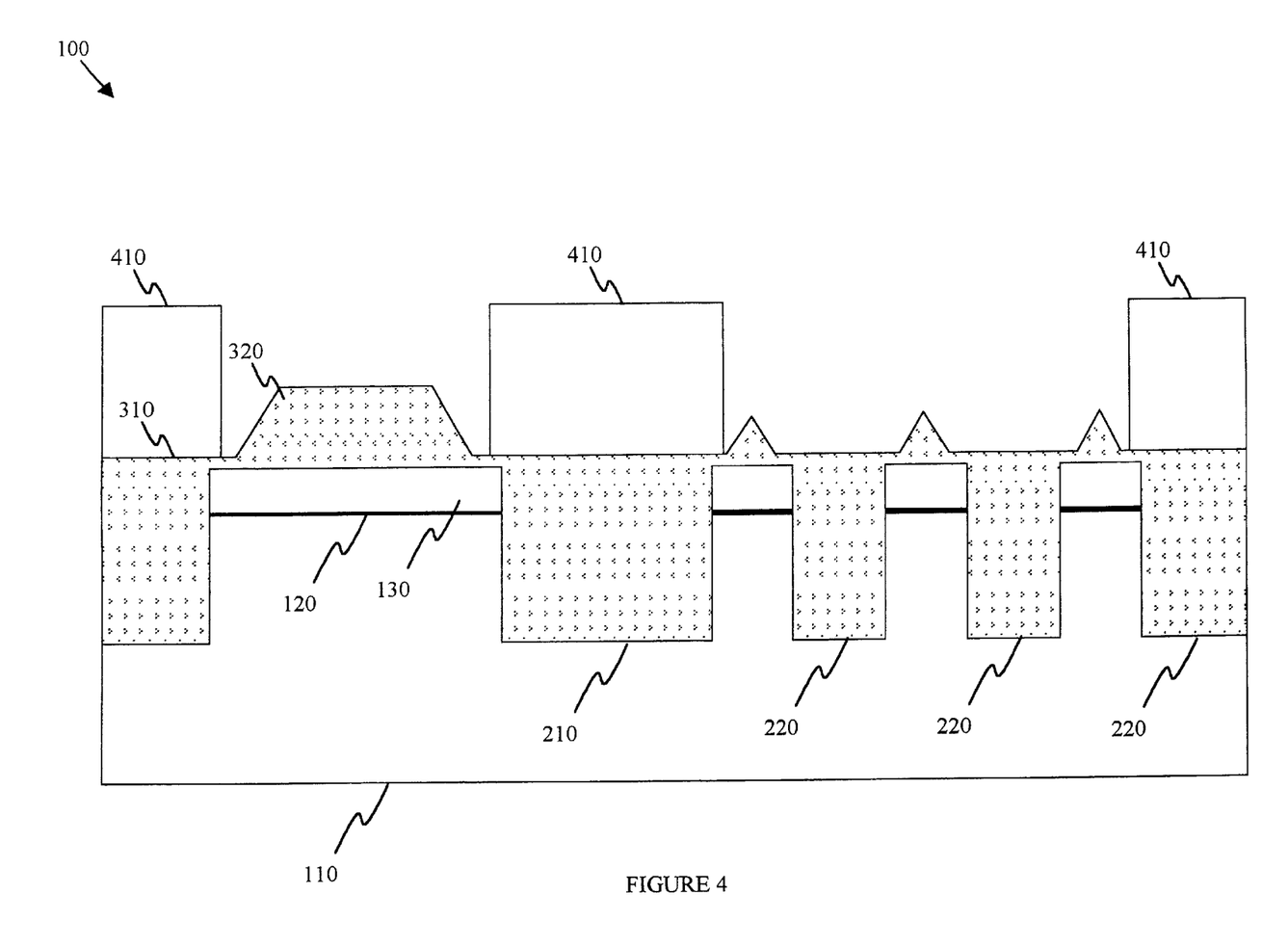
FIG. 4 illustrates the partially completed semiconductor device shown in FIG. 3, after using a reverse thin-ox mask to pattern a resist layer.

Turning to FIG. 4, illustrated is the partially completed semiconductor device shown in FIG. 3, after using a reverse thin-ox mask to pattern a resist layer 410. The reverse thin-ox process is well known to one skilled in the art and is only briefly discussed. As illustrated, the resist layer 410 is patterned, protecting the isolation trench 210 and leaving unprotected the alignment marks 220. It should be noted that the resist layer 410 protects the isolation trench 210 so that subsequent processing steps do not remove the oxide located within the isolation trench 210.

Figure 5:
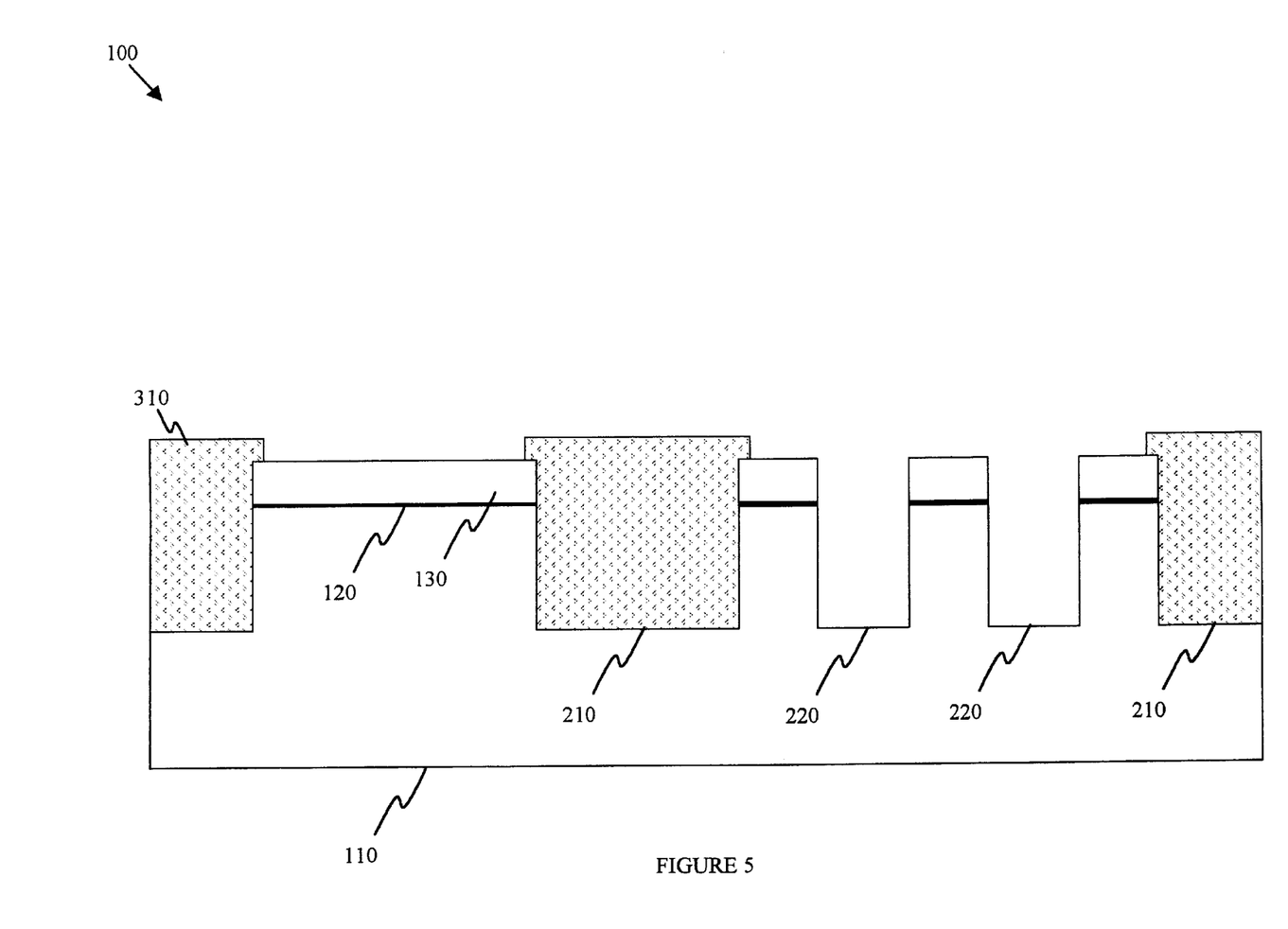
FIG. 5 illustrates the partially completed semiconductor device shown in FIG. 4, after a high oxide/nitride selective etch process.

Referring to FIG. 5 with continued reference to FIG. 4, after patterning the resist layer 210, the unprotected portions of the partially completed semiconductor device 100 may be subjected to a dry oxide etch, for example a high oxide/nitride selective etch process. Preferably the dry oxide etch removes the exposed oxide 310, including the mesas 320 and the oxide 310 within the alignment marks 220. After the dry oxide etch is completed, the resist layer 410 is stripped resulting in the partially completed semiconductor device 100 illustrated in FIG. 5.

Figure 6A:
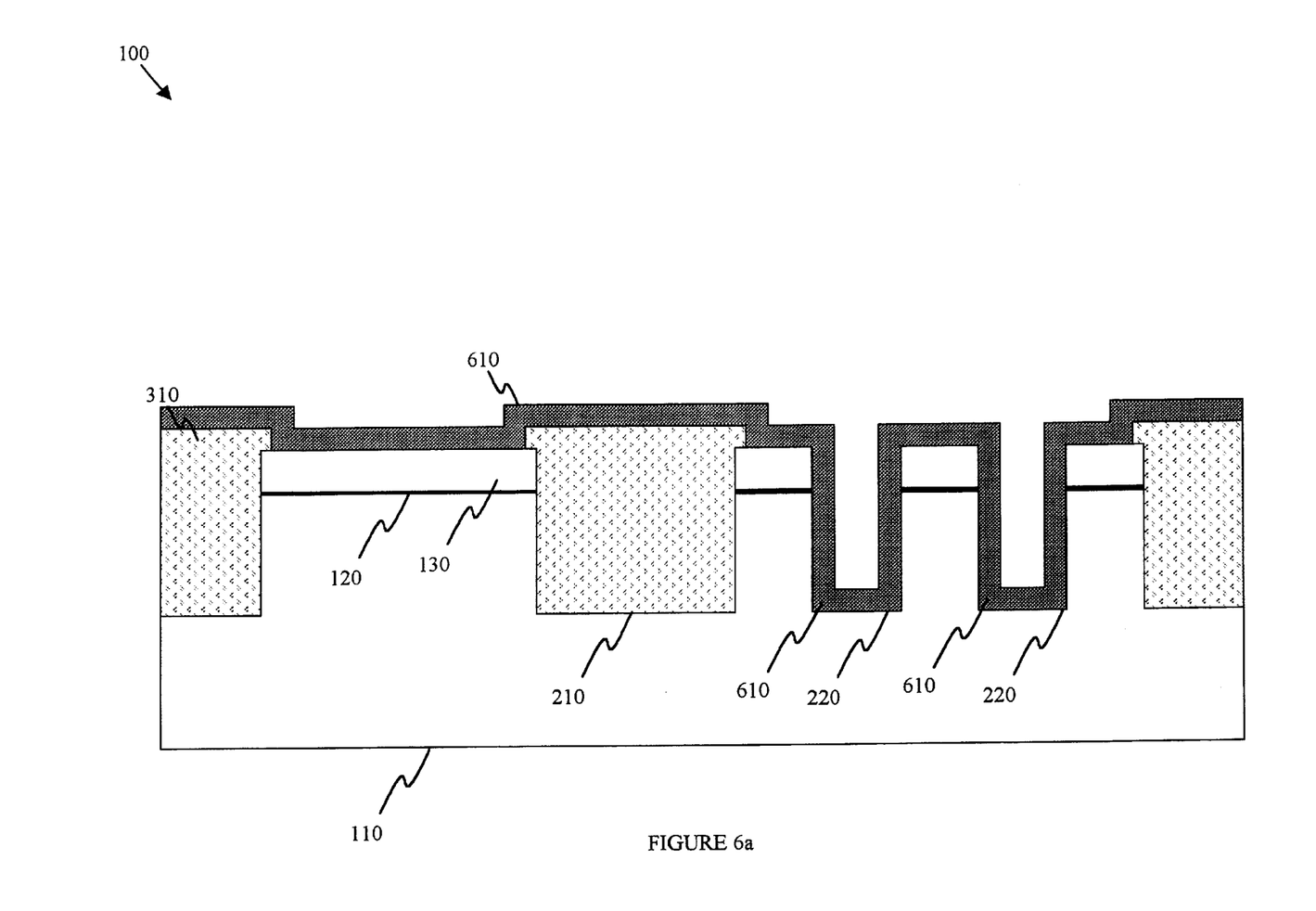
FIG. 6a illustrates the deposition of an etch stop layer over the surface of the partially completed semiconductor device, including within the alignment mark.

Turning to FIG. 6a, illustrated is the formation of an etch stop layer 610 over the surface of the partially completed semiconductor device 100. Uniquely, the etch stop layer 610 is formed within the alignment marks 220, and its purpose is to protect the silicon substrate 110 within the alignment mark 220 from a subsequent hydrofluoric (HF) etch process, described below., that is used to removed the nitride layer 130. The etch stop layer 610 may be an oxide layer, and it may be formed using any conventional process that results in a highly uniform film within the alignment mark 220, such as a high density plasma oxide deposition process. Other deposition processes may include a chemical vapor deposition process or a silicon oxidation process. Moreover, the etch stop layer 610 may be formed to a thickness of about 60 nm.

Figure 6B:
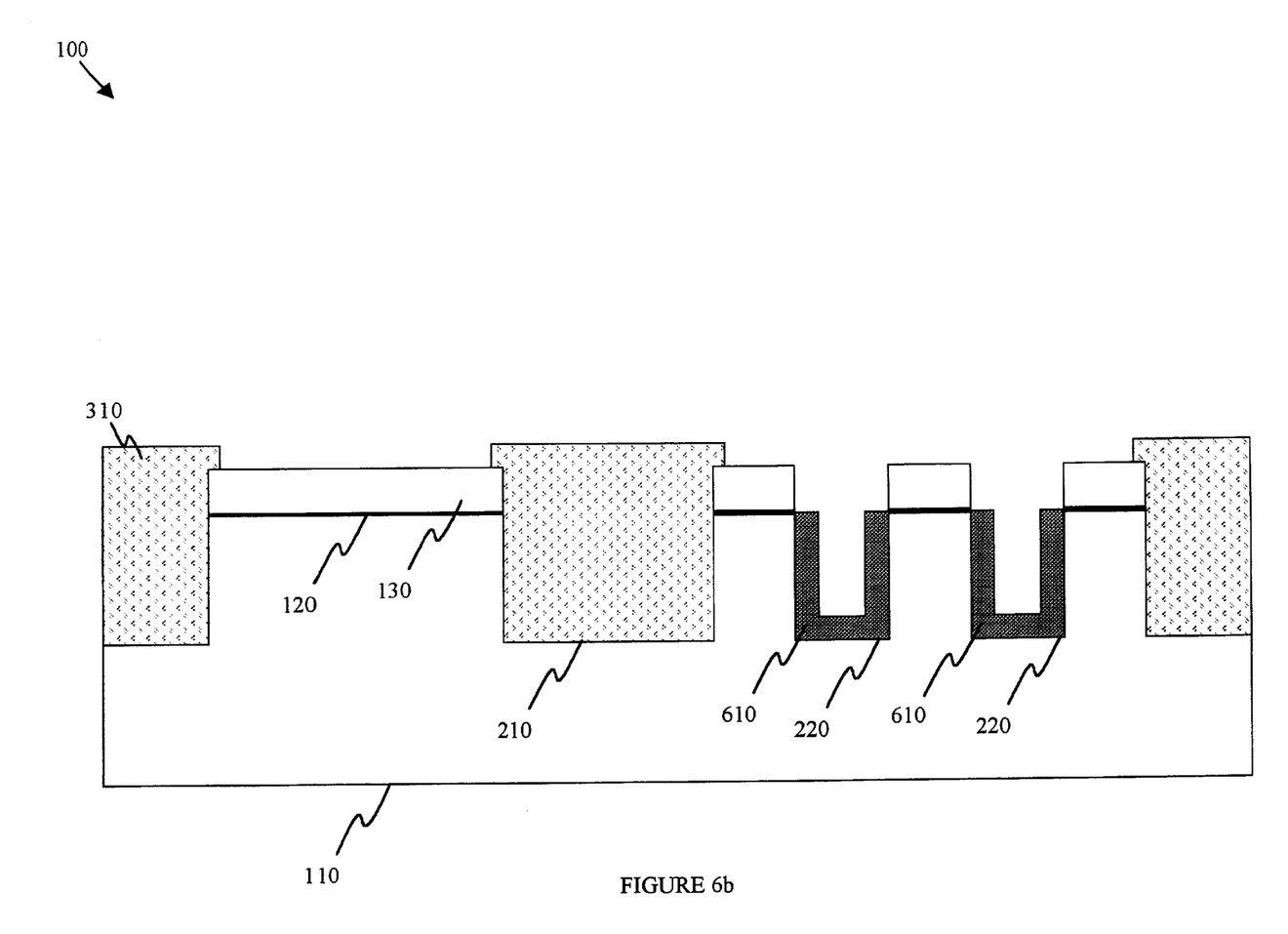
FIG. 6b illustrates the deposition of an etch stop layer within the alignment mark, using a silicon oxidation process.

Forming the etch stop layer 610 using the silicon oxidation process theoretically provides added benefits. For example, the silicon oxidation process densifies the etch stop layer 610, which provides a more robust etch stop layer. To form the etch stop layer 610 using the silicon oxidation process, the partially completed semiconductor device 100, including the exposed silicon substrate 110 within the alignment marks 220, is oxidized at a temperature ranging from about 750° C. to about 1050° C. This is typically a rapid thermal anneal or a conventional furnace anneal. Since the oxidation occurs on the exposed silicon substrate 110, the etch stop layer 610 forms in the alignment marks 220, as shown in FIG. 6b. Regardless of the deposition process used to form the etch stop layer 610, the thickness of the etch stop layer 610 should be sufficient to protect the silicon from any low silicon selectivity etch process. For example, the thickness of the etch stop layer 610 may be about 60 nm.

Figure 7:
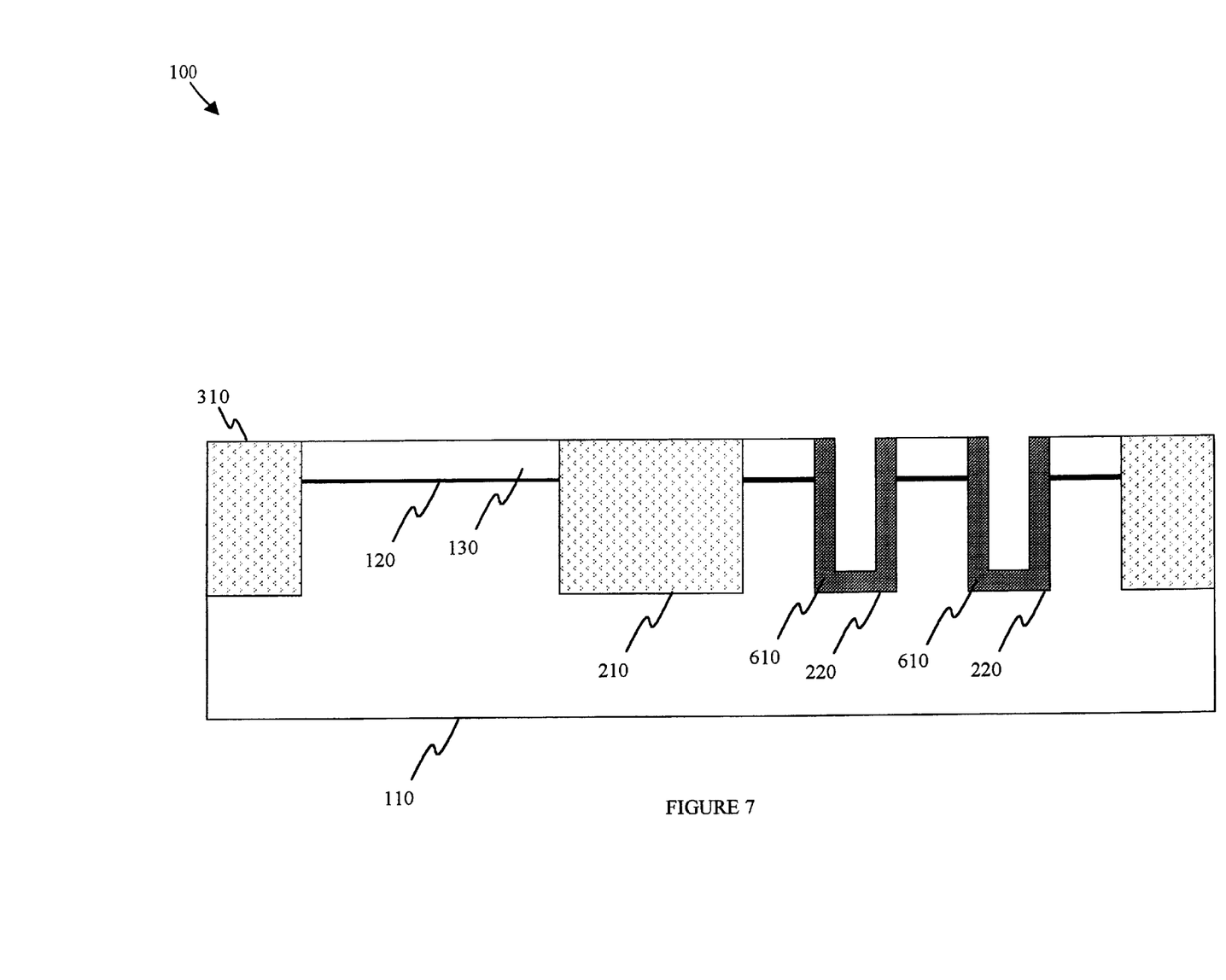
FIG. 7 illustrates the partially completed semiconductor device illustrated in FIG. 6a after a conventional residue removal process, for example a conventional chemical mechanical polishing (CMP) process.

Turning briefly to FIG. 7, illustrated is the partially completed semiconductor device 100 illustrated in FIG. 6a after a conventional residue removal process, such as a conventional CMP process. As illustrated, the CMP process may be conducted until substantially all the etch stop layer 610 (FIG. 6a) is removed from the surface of the isolation layer 130. It should be noted that the CMP process does not substantially affect the etch stop layer 610 within the alignment mark 220.

Figure 8:
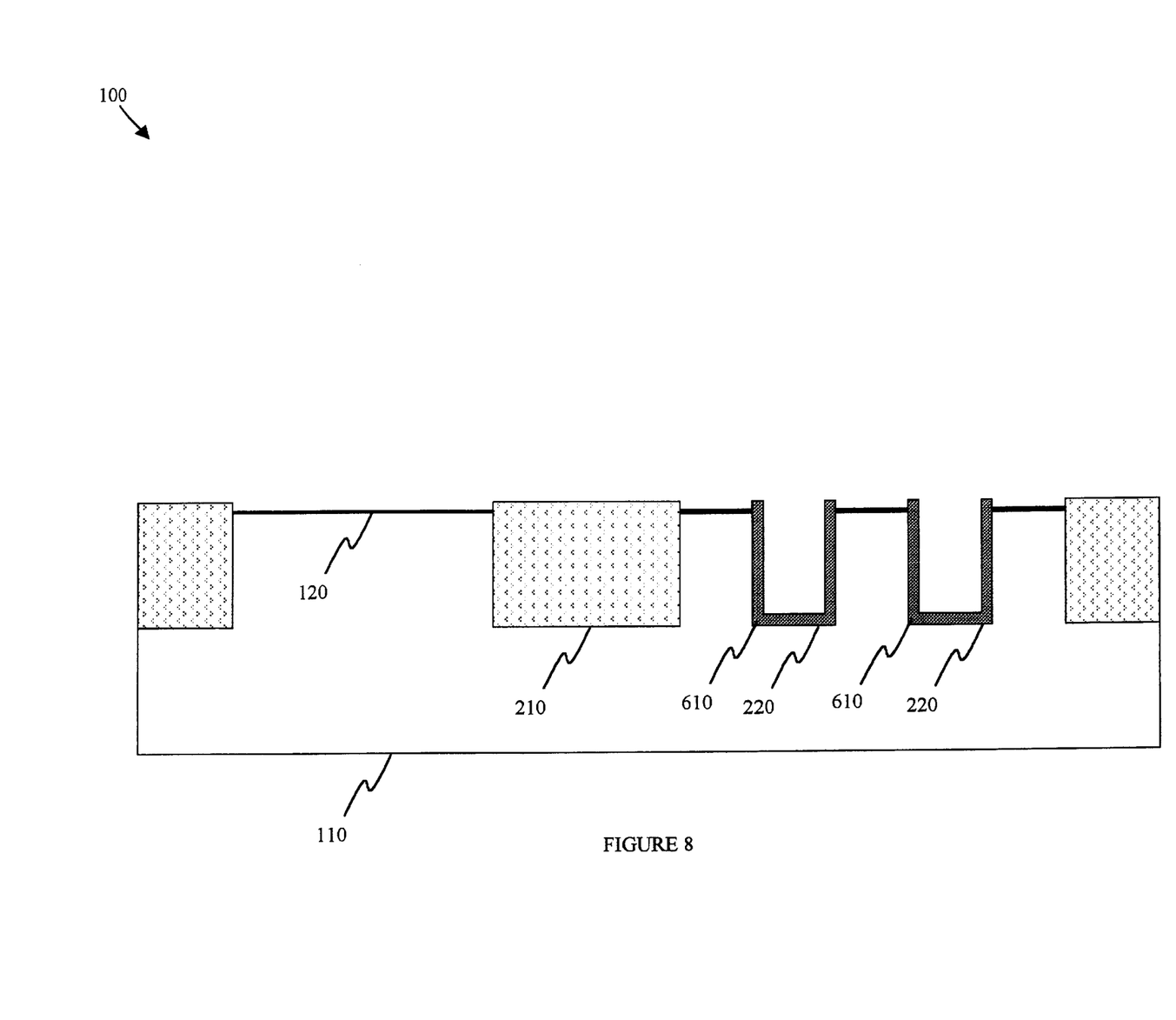
FIG. 8 illustrates the partially completed semiconductor device illustrated in FIG. 7, after removal of the isolation layer.

Referring to FIG. 8, illustrated is the partially completed semiconductor device 100 illustrated in FIG. 7, after removal of the isolation layer 130. Typically, the isolation layer 130 is removed with a hydrofluoric (HF) deglaze followed by a wet chemical nitride strip; however, the isolation layer 130 may be removed by other methods known to those skilled in the art. Because the oxide etch rate is less than the nitride etch rate, a portion of the etch stop layer 610 remains after the chemical strip. As a result, the chemical strip never contacts the silicon substrate. Therefore, the silicon substrate does not experience damage from the chemical strip, as experienced in the prior art devices and the topography relief of the alignment mark remains substantially intact.

Figure 9:
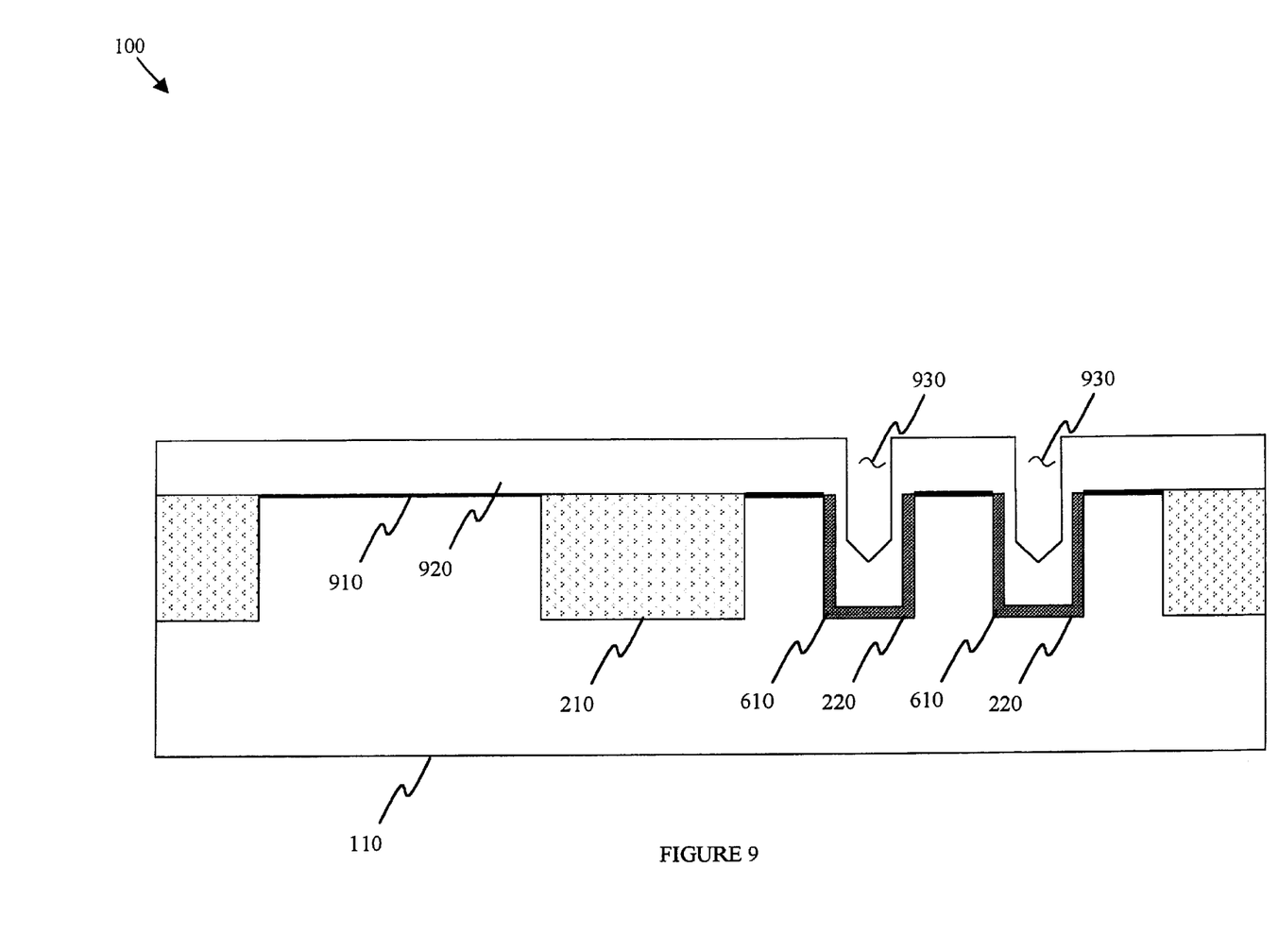
FIG. 9 illustrates the formation of a gate oxide layer and a gate stack layer.

After removal of the isolation layer 130, a conventional hydrofluoric (HF) etch process is used to remove the remaining pad oxide 120, and a sacrificial oxide (sac-oxide) (not shown) may be conventionally grown over the surface of the silicon substrate 110 to repair any superficial damage caused by any previous processing steps, if so desired. Next, the sac-oxide may be removed and a gate oxide layer 910 may be grown on the exposed surface of the silicon substrate, as illustrated in FIG. 9. After formation of the gate oxide layer 910, a gate stack layer 920 can be conventionally deposited on the surface of the partially completed semiconductor 100. The gate stack layer 920 is also deposited within the alignment marks 220 as shown. The gate stack layer 920 is of conventional design and typically comprises a doped poly-silicon layer and an upper reflective metallic layer, for example a tungsten silicide layer. One having skill in the art knows that the gate stack 920 is not limited to the doped poly-silicon layer and the tungsten silicide layer, and that other gate stack materials could easily be used within the scope of the present invention. Thus, the alignment marks 220 are particularly advantageous when used in conjunction with a gate stack comprising a reflective layer, but are equally well suited for gate stacks without the reflective layer.

Continuing to refer to FIG. 9, due to the high aspect ratio associated with the alignment mark, the gate stack layer 920 does not completely fill the alignment marks 220, which leaves easily detectable alignment mark steps 930. The depth of the alignment mark 220 is preferably co-extensive with the isolation trench 210, but its depth may range from about 200 nm to about 1000 nm. Moreover, the alignment marks 220 preferably have an aspect ratio of about 1 to 1.

Figure 10:
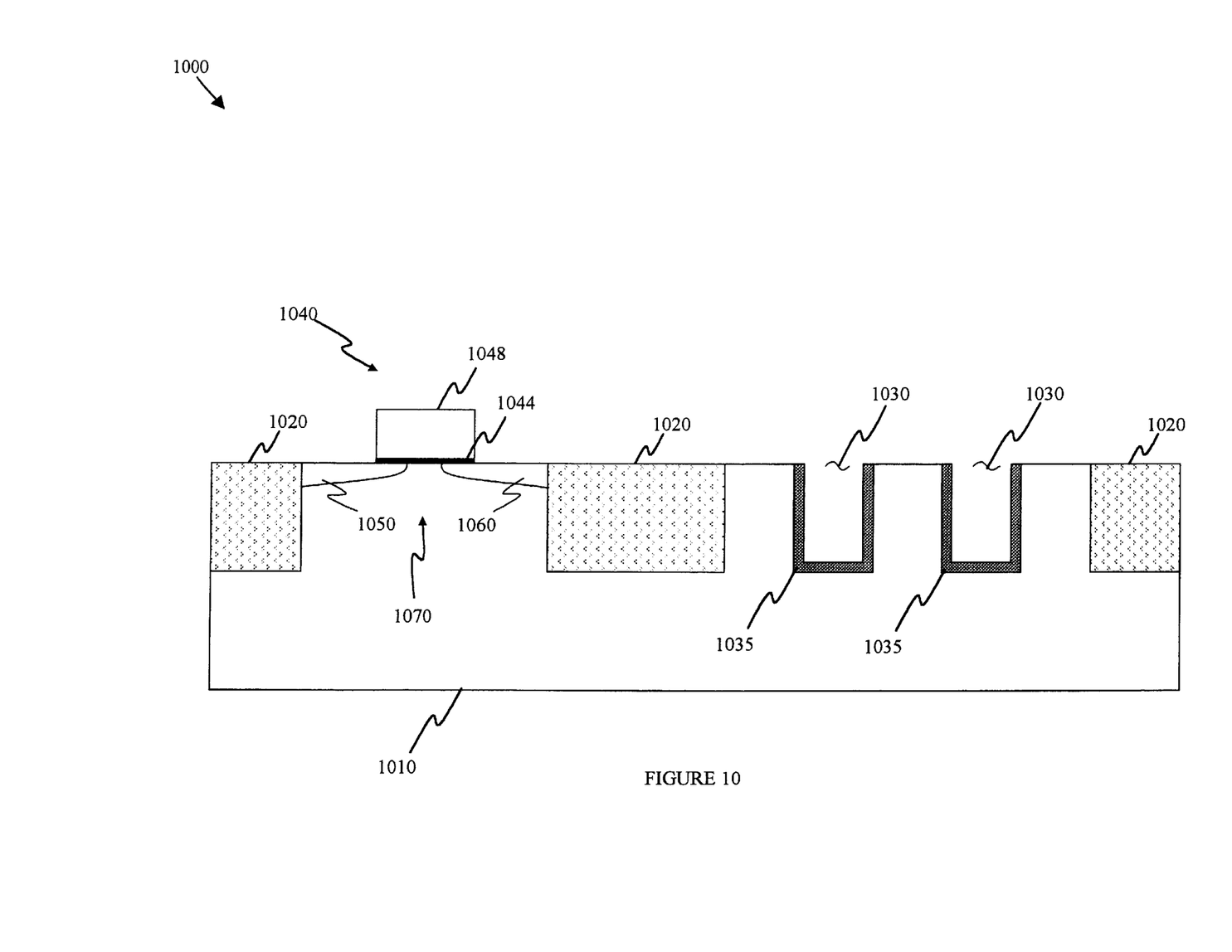
FIG. 10 illustrates a completed semiconductor device as disclosed by the present invention.

Turning to FIG. 10, after formation of the gate stack 920 the alignment mark steps 930 are used as reference markers by a conventional stepper device to accurately pattern a photoresist layer. The patterned photoresist layer (not shown) may then be used to define a conventional transistor device 1040, resulting in a completed semiconductor device 1000 as disclosed by the present invention. The conventional transistor device 1040 is formed on a conventional semiconductor substrate 1020 and includes, among other things, a gate oxide 1044, a gate stack 1048 and source/drain regions 1050, 1060, which contact isolation trenches 1020. The alignment marks 1030 with the etch stop layers 1035 are also shown.

Since the alignment marks 1030 are formed to substantially the same depth as the isolation structures 1020, the alignment feature problems caused by the small steps are eliminated. Moreover, the deposition of the etch stop layer 1035 substantially avoids chemical attack of the exposed silicon during the nitride strip. Moreover, since the alignment marks 1030 and the isolation structures 1020 may be formed through the isolation layer and into the substrate in a simultaneous processing step, the need for a dedicated alignment mark mask is eliminated, substantially reducing processing time and cost.

Figure 11:
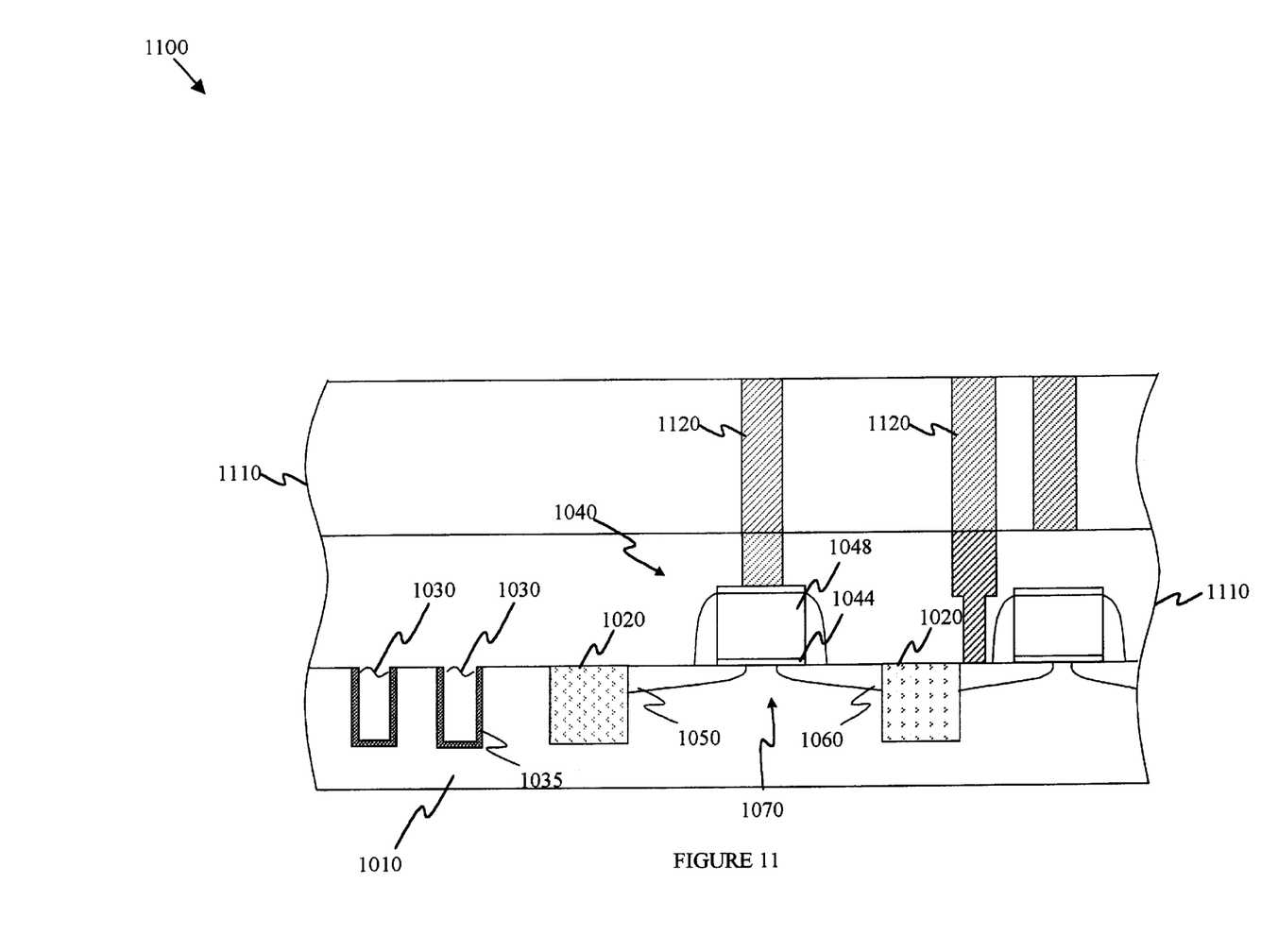
FIG. 11 illustrates a cross-sectional view of a conventional integrated circuit, which might be manufactured according to the principles of the present invention.

Turning briefly to FIG. 11 with continued reference to FIG. 10, there is illustrated a partial cross-sectional view of a lower portion of a conventional integrated circuit 1100 having the alignment marks covered by the present invention incorporated therein. The integrated circuit 1100 may include complementary metal oxide semiconductor (CMOS) devices, bipolar CMOS (BiCMOS) devices, dynamic random access memory (DRAM) devices, electrically erasable programmable read-only memory (EEPROM) devices, including Flash EPROMS, or any other type of similar device. Also shown in FIG. 11 are components of the conventional integrated circuit 1100, including: the transistor 1040, the gate oxide 1044, and the gate stack 1048, the isolation structures 1020 that make up part of a shallow trench isolation (STI) system, and the alignment marks 1030, including the etch stop layer 1035. Also included in the integrated circuit 1100 are the semiconductor substrate 1010, the source region 1050 and drain region 1060, the active region 1070 and dielectric layers 1110. Interconnect structures 1120 that are located within dielectric layers 1110 electrically connect the transistors 1040 to form an operative integrated circuit.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:

forming an isolation trench in a substrate;

forming an alignment mark in the substrate, wherein the alignment mark has a width less than about 1000 nm; and forming an etch stop layer in the alignment mark, wherein the etch stop layer does not completely fill the alignment mark, thereby causing the alignment mark to be a negative relief structure.

2. The method as recited in claim 1 wherein forming an isolation trench and an alignment mark includes forming an isolation trench and an alignment mark through a trench isolation layer located on the substrate.

3. The method as recited in claim 1 wherein forming an isolation trench and an alignment mark includes simultaneously forming an isolation trench and an alignment mark through a silicon nitride and pad oxide stack.

4. The method as recited in claim 1 wherein forming an etch stop layer includes forming an oxide layer.

5. The method as recited in claim 4 wherein forming an oxide layer includes forming an oxide layer using a process selected from the group consisting of:

a high density plasma oxide deposition process;

a chemical vapor deposition process; and a silicon oxidation process.

6. The method as recited in claim 1 wherein forming an isolation trench and an alignment mark includes forming an isolation trench and an alignment mark to a substantially common depth.

7. The method as recited in claim 6 wherein forming an isolation trench and an alignment mark includes forming an isolation trench and an alignment mark to a depth ranging from about 200 nm to about 1000 nm.

8. The method as recited in claim 7 wherein forming an isolation trench and an alignment mark to a depth ranging from about 200 nm to about 1000 nm includes forming an isolation trench and an alignment mark to a depth of about 300 nm.

9. A method of manufacturing an integrated circuit, comprising:

forming isolation trenches having an active region located therebetween;

forming an alignment mark in the substrate, wherein the alignment mark has a width less than about 1000 nm;

forming an etch stop layer in the alignment mark, wherein the etch stop layer does not completely fill the alignment mark, thereby causing the alignment mark to be a negative relief structure;

forming transistors over the active region; and forming interconnects in dielectric layers located over the transistors that electrically connect the transistors to form an operative integrated circuit.

10. The method as recited in claim 9 wherein forming isolation trenches and forming an alignment mark includes forming isolation trenches and forming an alignment mark through an trench isolation layer located on the substrate.

11. The method as recited in claim 9 wherein forming isolation trenches and forming an alignment mark includes simultaneously forming the isolation trenches and the alignment mark through a silicon nitride and pad oxide stack.

12. The method as recited in claim 9 wherein forming an etch stop layer includes forming an oxide layer.

13. The method as recited in claim 9 wherein forming an isolation trench and an alignment mark includes forming an isolation trench and an alignment mark to a substantially common depth.

14. The method as recited in claim 13 wherein forming isolation trenches and an alignment mark includes forming isolation trenches and an alignment mark to a depth ranging from about 200 nm to about 1000 nm.

15. The method as recited in claim 14 wherein forming isolation trenches and an alignment mark to a depth ranging from about 200 nm to about 1000 nm includes forming an isolation trench and an alignment mark to a depth of about 300 nm.

16. The method as recited in claim 9 wherein forming an alignment mark includes forming an alignment mark having a width ranging from about 200 nm to about 1000 nm.

17. The method as recited in claim 9 wherein forming transistors includes forming devices selected from the group consisting of:

a complementary metal oxide semiconductor device;

a bipolar complementary metal oxide semiconductor device;

a dynamic random access memory device; and an electrical erasable programmable read-only memory device.

* * * * *